(12) United States Patent
Thorp et al.

(10) Patent No.: US 7,870,472 B2
(45) Date of Patent: *Jan. 11, 2011

(54) METHODS AND APPARATUS FOR EMPLOYING REDUNDANT ARRAYS TO CONFIGURE NON-VOLATILE MEMORY

(75) Inventors: Tyler Thorp, Sunnyvale, CA (US); Brent Haukness, Monte Sereno, CA (US)

(73) Assignee: SanDisk 3D LLC, Milpitas, CA (US)

( * ) Notice: Subject to any disclaimer, the term of this patent is extended or adjusted under 35 U.S.C. 154(b) by 867 days.

This patent is subject to a terminal disclaimer.

(21) Appl. No.: 11/669,918

(22) Filed: Jan. 31, 2007

(65) Prior Publication Data

US 2008/0184065 A1    Jul. 31, 2008

(51) Int. Cl.
*G06F 11/18* (2006.01)
*G06F 11/24* (2006.01)

(52) U.S. Cl. ...................... 714/797; 714/725
(58) Field of Classification Search .................. None
See application file for complete search history.

(56) References Cited

U.S. PATENT DOCUMENTS

| | | | | |
|---|---|---|---|---|
| 4,404,647 A | * | 9/1983 | Jones et al. | 714/5 |
| 5,086,429 A | | 2/1992 | Gray et al. | |
| 5,128,944 A | | 7/1992 | Flaherty et al. | |
| 5,274,831 A | * | 12/1993 | Katsuta | 712/244 |
| 5,311,476 A | * | 5/1994 | Kajimoto et al. | 365/222 |
| 5,426,378 A | | 6/1995 | Ong | |
| 5,450,460 A | | 9/1995 | Stodieck | |
| 5,502,728 A | | 3/1996 | Smith, III | |
| 5,684,978 A | | 11/1997 | Sarma et al. | |
| 5,757,160 A | | 5/1998 | Kreuzer | |
| 6,002,620 A | | 12/1999 | Tran et al. | |
| 6,208,549 B1 | * | 3/2001 | Rao et al. | 365/96 |
| 6,356,637 B1 | * | 3/2002 | Garnett | 380/265 |
| 6,526,559 B2 | | 2/2003 | Schiefele et al. | |

(Continued)

FOREIGN PATENT DOCUMENTS

EP    0 433 979 A3    6/1991

OTHER PUBLICATIONS

Mange, Analysis and Synthesis of Logic Systems, Artech House, Inc., 1986, pp. 78, 368.

(Continued)

*Primary Examiner*—Cynthia Britt
*Assistant Examiner*—Dipakkumar Gandhi
(74) *Attorney, Agent, or Firm*—Dugan & Dugan, PC

(57) ABSTRACT

Systems, methods and apparatus are disclosed for employing redundant arrays to configure non-volatile memory. The present invention may include a substrate including a plurality of memory arrays, wherein the memory arrays include a data array and at least three redundant configuration arrays. The configuration arrays may each be adapted to be programmed with identical configuration information associated with operation of the data array. Majority voting logic with an output coupled to configuration inputs of the data array and inputs coupled to each of the redundant configuration arrays may be employed. The majority voting logic may be adapted to determine a configuration for the data array based upon an outcome of a majority vote function applied to the configuration information stored in the configuration arrays. Numerous other aspects are disclosed.

18 Claims, 4 Drawing Sheets

U.S. PATENT DOCUMENTS

| | | | |
|---|---|---|---|
| 6,615,388 B1* | 9/2003 | Takamichi | 714/795 |
| 6,654,287 B2* | 11/2003 | Visconti | 365/185.22 |
| 6,657,888 B1* | 12/2003 | Doudin et al. | 365/158 |
| 6,762,509 B2 | 7/2004 | Hilton et al. | |
| 7,036,059 B1 | 4/2006 | Carmichael et al. | |
| 7,069,493 B2* | 6/2006 | Takahashi et al. | 714/763 |
| 7,142,471 B2* | 11/2006 | Fasoli et al. | 365/200 |
| 7,254,746 B1* | 8/2007 | Kaushik et al. | 714/27 |
| 7,315,474 B2* | 1/2008 | Lue | 365/185.18 |
| 2001/0006529 A1 | 7/2001 | Komori et al. | |
| 2004/0141353 A1* | 7/2004 | Madan | 365/145 |
| 2006/0140026 A1 | 6/2006 | Ilkbahar et al. | |
| 2006/0204794 A1 | 9/2006 | Kikuchi et al. | |
| 2007/0038852 A1 | 2/2007 | Bovino et al. | |
| 2007/0198809 A1 | 8/2007 | Beausoleil et al. | |
| 2008/0184004 A1 | 7/2008 | Thorp et al. | |
| 2008/0184005 A1 | 7/2008 | Thorp et al. | |
| 2008/0184057 A1 | 7/2008 | Thorp et al. | |

OTHER PUBLICATIONS

Office Action of U.S. Appl. No. 11/669,917 mailed Jan. 15, 2009.
Hight et al., Dissent in a Majority Voting System, Computers, IEEE Transactions, vol. C-22, Issue 2, pp. 168-171 (1973) (abstract only).
Jul. 16, 2009 Reply to Jun. 24, 2009 Notice of Non-Compliant Amendment of U.S. Appl. No. 11/669,917.
Notice of Non-Compliant Amendment of U.S. Appl. No. 11/669,917 mailed Jun. 24, 2009.
Apr. 15, 2009 Reply to Jan. 15, 2009 Office Action of U.S. Appl. No. 11/669,917.
Feb. 23, 2010 Reply to Final Office Action of U.S. Appl. No. 11/669,917 mailed Nov. 23, 2009.
Office Action of U.S. Appl. No. 11/669,917 mailed Apr. 12, 2010.
Final Office Action of related U.S. Appl. No. 11/669,917 mailed Nov. 23, 2009.
Jun. 30, 2010 Reply to Apr. 12, 2010 Office Action of U.S. Appl. No. 11/669,917.
Notice of Allowance and Examiner-Initiated Interview Summary of U.S. Appl. No. 11/669,917 mailed Sep. 13, 2010.

* cited by examiner

METHODS AND APPARATUS FOR EMPLOYING REDUNDANT ARRAYS TO CONFIGURE NON-VOLATILE MEMORY

RELATED APPLICATIONS

The present application is related to commonly owned, U.S. patent application Ser. No. 11/669,917 entitled "METHODS AND APPARATUS FOR EMPLOYING REDUNDANT ARRAYS TO CONFIGURE NON-VOLATILE MEMORY," filed on even date herewith and hereby incorporated herein by reference.

The present application is also related to commonly owned, U.S. patent application Ser. Nos. 11/669,919 and 11/669,923 both entitled "METHODS AND APPARATUS FOR USING A CONFIGURATION ARRAY SIMILAR TO AN ASSOCIATED DATA ARRAY," both filed on even date herewith and both hereby incorporated herein by reference.

FIELD OF THE INVENTION

The present application relates to memory arrays, and more specifically, the present invention relates to configuration arrays used to program or configure data arrays.

BACKGROUND

Non-volatile memory arrays designed for storing user data, for example, within various memory devices such as secure digital (SD) cards, memory sticks, compact flash cards, USB flash drives, picture cards, etc., may be configured using information stored within the memory devices. In some cases, the configuration information may be critical for the operation of the memory array. Thus, what is needed are methods and apparatus to ensure that the configuration information is preserved and available for use by the memory device.

SUMMARY OF THE INVENTION

In some aspects, the present invention provides a memory that includes a substrate including a plurality of memory arrays, wherein the memory arrays include a data array, and at least three redundant configuration arrays. The configuration arrays are each adapted to be programmed with identical configuration information associated with operation of the data array.

In other aspects, the present invention provides a memory including a substrate including a plurality of memory arrays, wherein the memory arrays include a data array and at least three redundant configuration arrays. The configuration arrays are each adapted to be programmed with identical configuration information associated with operation of the data array. The memory further includes majority logic having an output coupled to configuration inputs of the data array and inputs coupled to each of the configuration arrays. The majority logic is adapted to determine a configuration for the data array based upon an outcome of a majority vote function applied to the configuration information stored in the configuration arrays.

In yet other aspects, the present invention provides a memory including a plurality of memory arrays including a primary array and a plurality of configuration arrays. The configuration arrays are each adapted to store redundant configuration information associated with operation of the primary array.

In still yet other aspects, the present invention provides a method including loading configuration information into a plurality of latches; and programming at least three redundant configuration arrays using the configuration information in the latches. A data array is adapted to be configured in accordance with the configuration information programmed into the configuration arrays.

In further aspects, the present invention provides a method including loading configuration information into a plurality of latches; programming at least three redundant configuration arrays identically using the configuration information in the latches; and coupling a data array to each of the configuration arrays via selection logic. The data array is adapted to be configured in accordance with the configuration information programmed into the configuration arrays and selected by the selection logic.

In yet further aspects, the present invention provides a method including reading nominally redundant configuration information from each of a plurality of configuration arrays; selecting configuration information from among the nominally redundant configuration information based upon a selection function; and configuring a data array associated with the nominally redundant configuration information using the selected configuration information.

In still yet further aspects, the present invention provides a method including programming at least three redundant configuration arrays based on configuration information; and associating a data array with each of the configuration arrays. The data array is adapted to be configured in accordance with the configuration information programmed into the configuration arrays.

In additional aspects, the present invention provides a method of manufacturing a memory including determining a number of configuration arrays; determining a distribution of the number of configuration arrays on a substrate; and programming each of the configuration arrays with redundant configuration information.

In yet additional aspects, the present invention provides a medium storing computer readable instructions, the instructions adapted to cause nominally redundant configuration information to be read from each of a plurality of configuration arrays; configuration information to be selected from among the nominally redundant configuration information based upon a selection function; and a data array associated with the nominally redundant configuration information to be configured using the selected configuration information.

Other features and aspects of the present invention will become more fully apparent from the following detailed description, the appended claims and the accompanying drawings.

DETAILED DESCRIPTION

Figure 1:
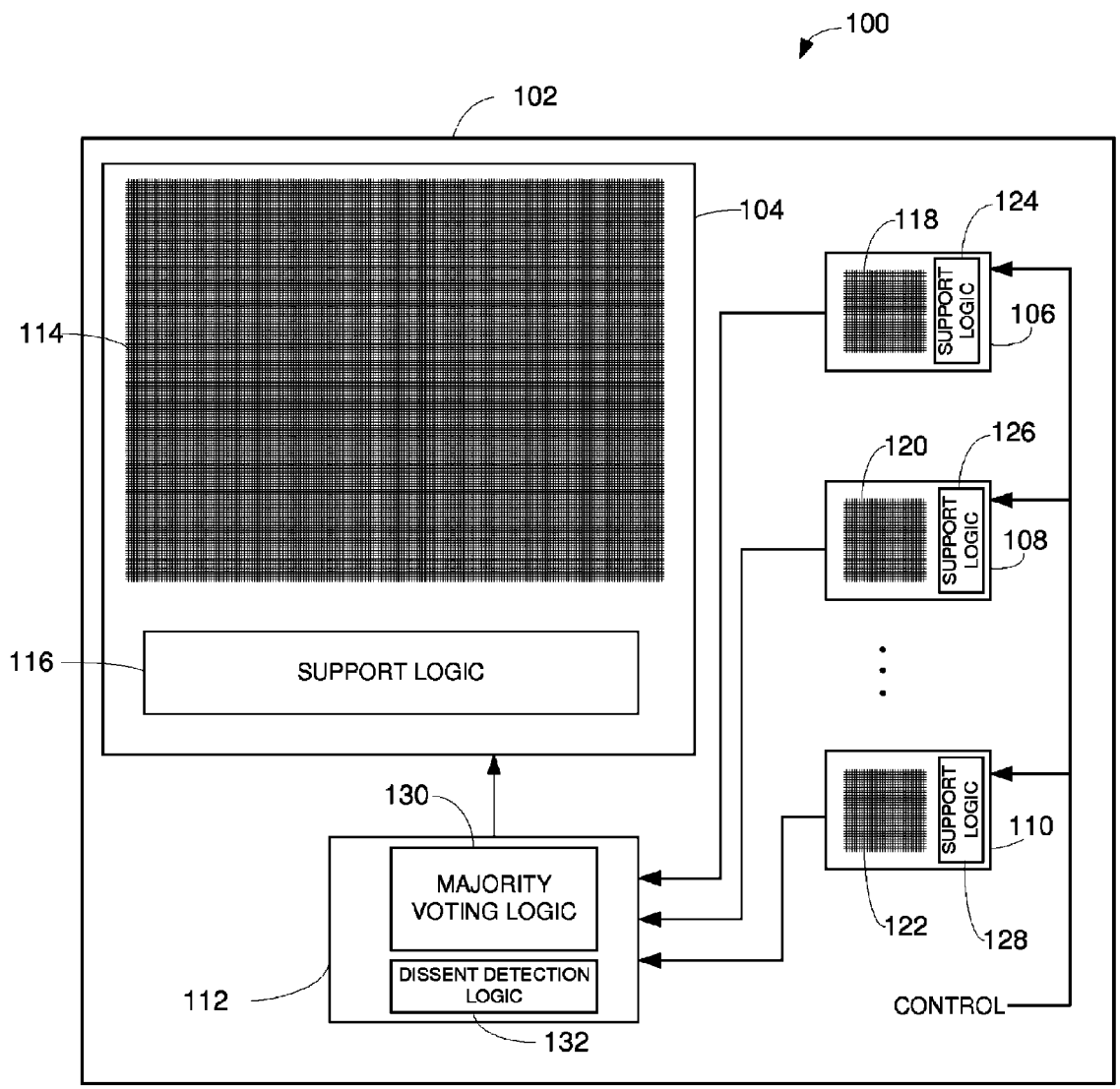
FIG. 1 is a schematic block diagram that depicts a memory system according to some embodiments of the present invention.

The present invention provides systems, methods, and apparatus for employing independent, redundant configuration arrays to program an associated data array in a memory system. In large memory arrays that use highly dense memory cells, a small number of cells in such arrays may become unstable due to various reasons such as manufacturing defects, radiation, material impurities, etc. Conventional approaches used to deal with such unstable cells (e.g., replacement cells) may be inadequate in the case of a configuration array due to the critical function that configuration information stored therein fulfills, particularly in non-volatile memory systems. Thus, the use of redundant configuration arrays according to the present invention provides a robust and efficient alternative to conventional error correcting methods especially in conjunction with the use of large data arrays. In some embodiments of the present invention, three or more redundant configuration arrays are used (with a majority voting circuit) to store and provide configuration information to a data array. Each configuration array is electrically separate and distinct such that a defect in one array does not and cannot affect the other arrays.

The configuration arrays may be identical to each other in that their physical layout and the information they each store are the same. In response to a control signal, configuration information may be read from each of the configuration arrays (either concurrently or serially) and the information from the three or more arrays may be compared. If the information from each of the redundant configuration arrays is identical (e.g., there is concordance among all the configuration arrays), it may be assumed with a high degree of certainty that the information is correct, and the data array is programmed and/or configured using the information. If, on the other hand, there is an inconsistency (e.g., due to an error condition) among the information output from the configuration arrays, the majority voting logic may be employed to select a value for the configuration information based upon a simple majority vote (e.g., the value that occurs the most frequently among the three (or more) values output by the configuration arrays is selected). In terms of yield improvement, an embodiment of the present invention using three configuration arrays provides a better yield than using one repair row and one repair column for each configuration array memory cell. In terms of reliability improvement, the same embodiment using three configuration arrays where each memory cell in each of the three configuration arrays are tested after programming and required to be functional, provides the equivalent of a one bit detection, one bit correction error correcting code scheme for each bit. Therefore, the elegant simplicity of using redundant configuration arrays, which not only makes the present invention easy to implement, eliminates both the need for conventional row and column redundancy schemes as well as error correction codes while improving both the yield and reliability of the configuration array, and thus, ultimately the yield and reliability of the memory system.

Turning to FIG. 1, a memory system 100 according to present invention may be embodied on a substrate 102, for example, such as on a semiconductor substrate. The system 100 may include a primary or data array 104 and a plurality of configuration arrays 106, 108, 110 each coupled to the data array via logic 112. The data array 104 may be used to store user data, the configuration arrays 106, 108, 110 may be used to store redundant copies of configuration information, and the logic 112 may be used to select a value for the configuration information if the configuration arrays 106, 108, 110 provide inconsistent information. The data array 104 may include a non-volatile memory array 114 and support logic 116 for programming the memory array 114. Likewise, the configuration arrays 106, 108, 110 may each include a non-volatile memory array 118, 120, 122, respectively, and support logic 124, 126, 128, respectively. The logic 112 may include majority voting logic 130 and, in some embodiments, dissent detection logic 132. The components of the logic 112 are described in detail below.

The data array 104 and the configuration arrays 106, 108, 110 may each include any type of memory arrays including arrays comprising two-terminal memory cells, three dimensional (3D) memory (e.g., any memory that includes two or more active memory elements vertically arranged), antifuse based memory cells, fuse based memory cells, flash memory cells, NAND flash memory cells, electrically erasable programmable memory cells, ultraviolet erasable programmable memory cells, magnetic memory cells, one time programmable memory cells, ferroelectric random access memory (RAM) cells, carbon nano-tube based memory cells, etc. The data array 104 and the configuration arrays 106, 108, 110 may each be of any size, for example, such as 64 bits, 64 megabits, 64 gigabytes, 64 terabytes, etc. Other size memories may be used. In some embodiments, the data array 104 may be a stand alone memory array and in other embodiments the data array 104 may be part of a larger system such as a general purpose computer or an embedded controller. In some embodiments, the data array 104 and/or the configuration arrays 106, 108, 110 may each span across two or more substrates and/or be located on two or more different substrates.

The data array 104 may be adapted to store any type of information including general user data. The support logic 116 associated with the data array 104 may be adapted to program (e.g., write to) and configure the data array. The support logic 116 may include latches for storing incoming configuration information (e.g., trimbit latches), word and bit line decoders, read and write voltage regulators, a page register, etc. Separate from user data or information stored in the data array 104, the data array 104 may be programmed and configured based on a plurality of parameters referred to herein as configuration information. The configuration information may include values for selecting among various modes of operation, voltage sensing levels, voltage regulator control levels, trimbit values, trimfuse values, voltage reference levels, and the like. In some embodiments, the configuration information may also define the logical structure (e.g., the capacity, the address space, the row and/or column width, etc.) of the data array 104.

The configuration arrays 106, 108, 110, which each may store a redundant copy of the configuration information, may be identical to each other, both structurally and in terms of the information each one stores. As indicated above, each of the configuration arrays 106, 108, 110 may be both physically and electrically isolated from each other. For example, each of the configuration arrays 106, 108, 110 may include separate and distinct voltage regulators for providing word and bit line biasing. In some embodiments, each of the configuration arrays 106, 108, 110 may be structurally identical to the data array 104. However, the configuration arrays 106, 108, 110 may include a smaller memory array 118, 120, 122 (and associated support logic 124, 126, 128) than the data array 104 to save space on the substrate 102 and/or simply because only a limited amount of memory is needed to store the configuration information relative to the amount of user data capacity of the data array 104. In general, the data array 104, which will typically be many orders of magnitude larger than the configuration arrays 106, 108, 110 (e.g., billions of bits versus only hundreds of bits), may be designed primarily based on area considerations (e.g., minimizing the amount of space required). In contrast, the relatively small configuration arrays 106, 108, 110, may be designed primarily to power up quickly, operate with power supplies that may be noisy, and to function reliably in non-idea conditions.

In some embodiments, the physical orientation of the word lines and bit lines of the configuration arrays 106, 108, 110 and the data array 104 may be the same. This may insure that each of the memory arrays 114, 118, 120, 122 perform similarly with regards to electrical characteristics and do not include variations that may occur as the result of having different circuit orientations relative to the substrate 102 (e.g., variations due to marginalities). In some embodiments, the support logic 124, 126, 128 of the respective configuration arrays 106, 108, 110 may be adapted to receive the configuration data from a host (not shown). In other words, as part of an initial configuration process (e.g., during manufacturing or during a pre-use "formatting" operation), data representative of the configuration information may be programmed into (e.g., written into) each of the configuration arrays 106, 108, 110 via the support logic 124, 126, 128 using latches, registers, and/or buffers in the support logic 124, 126, 128.

In some embodiments, the system 100 may include three configuration arrays 106, 108, 110. The use of three configuration arrays 106, 108, 110 may result in a simple resolution using a majority vote function if there is one configuration array that provides erroneous configuration information different than the two other configuration arrays. However, in the low probability case of two configuration arrays providing incorrect information (e.g., two memory cells responsible for storing the same information in two different configuration arrays both erroneously changing state/becoming unstable), a system with three configuration arrays that uses a majority voting function alone to resolve inconsistencies will select the erroneous value.

Depending on various factors such as the size of the configuration arrays and the required/desired reliability and/or cost of the system, different strategies may be employed to address the potential propagation of the unlikely but possible error condition described above and/or to improve the yield. For example, additional configuration arrays (e.g., 5, 7, 9, etc.) may be included and employed in the system 100. As each additional configuration array is added to the system 100, the possibility of a majority vote resulting in an erroneous outcome decreases substantially. Using an odd number of configuration arrays insures that a voting tie is avoided. Alternatively or additionally, error correcting codes (ECC) bits may be included and employed, for example, to identify values that may be erroneous despite being in the majority. Alternatively or additionally, in some embodiments, only two configuration arrays may be used in conjunction with a simple error detection circuit. For example, if an error is detected in a first configuration array, instead of time consumingly attempting to compute or reconstruct the correct value (e.g., as may be done using conventional ECC bits), the correct value may be immediately read from the second configuration array. In such an embodiment, only if the second configuration array indicates an error does it become necessary to rely on a reconstruction algorithm to compute the correct values. Other alternative strategies using the dissent detection logic described below may also be used to avoid propagating erroneous configuration information. Thus, the present invention includes defining a desired reliability and/or yield threshold and selecting a number of configuration arrays to include in the system 100 based upon the desired reliability and/or yield threshold.

In some embodiments, the configuration arrays 106, 108, 110 may be disposed on different substrates to further electrically and physically isolate the configuration arrays 106, 108, 110 from each other. In other words, if a physical impact or short occurs in one configuration array, the system 100 may be made more fault tolerant by locating the remaining configuration arrays on a different chip. In other embodiments, the configuration arrays 106, 108, 110 may be disposed upon the same substrate but distributed at different locations on the substrate. The locations of the configuration arrays 106, 108, 110 may be selected based upon a number of different considerations. For example, the configuration arrays 106, 108, 110 may be located to avoid physical or electrical stress points on the substrate 102 (e.g., corners of the substrate 102), and/or located to physically separate the configuration arrays 106, 108, 110 by a maximized possible distance, and/or located to comply with signal timing requirements between the system components, and/or located to improve reliability, and/or located to improve yield, and/or located based on any practicable combination of the above considerations.

In operation, once identical configuration is programmed into each of the configuration arrays 106, 108, 110, a control signal may be used to initiate a read of the configuration information. For example, scan chains in the support logic 124, 126, 128 of the configuration arrays may be used to program the configuration information into the configuration arrays 106, 108, 110. The configuration information from the same memory locations in each of the different configuration arrays 106, 108, 110 is transferred to the majority voting logic 130 to be compared. The majority voting logic 130 is adapted to select the most likely correct value of the configuration information based on the most frequently occurring value from among the plurality of configuration arrays 106, 108, 110. The selected value is passed to the support logic 116 of the data array 104 and is used to configure the memory array 114 of the data array 104.

Figure 2:
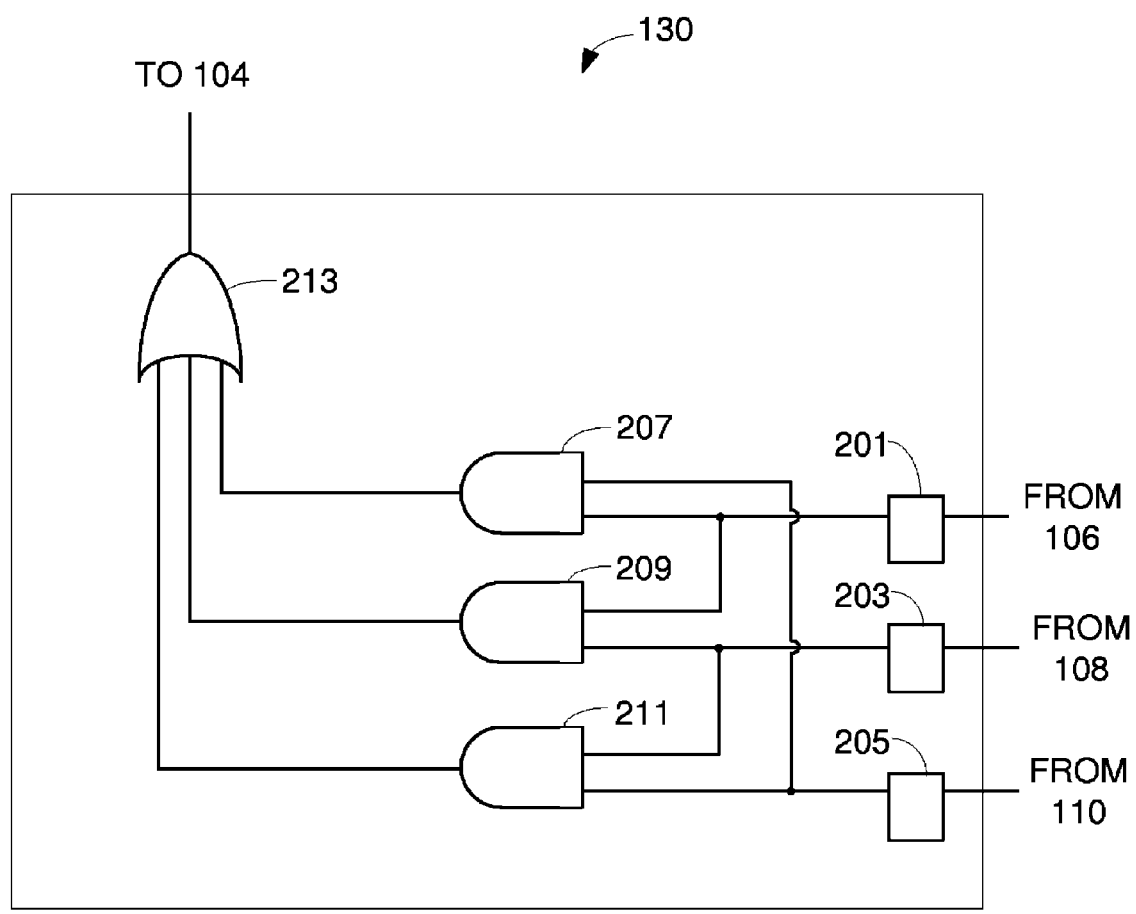
FIG. 2 is a schematic block diagram that depicts majority voting logic that may be used with some embodiments of the present invention.

Turning to FIG. 2, details of an example embodiment of the majority voting logic 130 are described. The logic circuit depicted in FIG. 2 is an example depicting how a single bit of configuration information may be selected from among three bits, each from one of three redundant configuration arrays 106, 108, 110. Note that additional inputs, latches, and gates may be used if additional configuration arrays were included in the system 100 (FIG. 1). Also note that the majority voting logic 130 may be implemented with many similar parallel logic circuits to allow bytes, words, double words, etc. of configuration data to be processed concurrently.

The example majority voting logic circuit 130 of FIG. 2 includes three latches 201, 203, 205 each with inputs coupled to one of the data busses coming from a different configuration array 106, 108, 110. The outputs of the three latches 201, 203, 205 are each coupled to one of two inputs of two of three And gates 207, 209, 211 such that each And gate 207, 209, 211 is coupled to a different pair of latches 201, 205; 201, 203; and 203, 205. The outputs of each And gate 207, 209, 211 are coupled to the inputs of an Or gate 213 and the output of the Or gate is coupled to the data array 104.

The following truth table indicates the values output by the example majority voting logic circuit 130 of FIG. 2 for each possible set of input values:

| INPUTS | | | OUTPUT |
|---|---|---|---|
| A | B | C | F(A, B, C) |
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |

-continued

| INPUTS | | | OUTPUT |
|---|---|---|---|
| A | B | C | F(A, B, C) |
| 1 | 0 | 1 | 1 |
| 1 | 1 | 0 | 1 |
| 1 | 1 | 1 | 1 |

Thus, the above table defines a majority vote function for three inputs that may be used to select a value for a single bit of configuration information when the configuration information from three nominally redundant configuration arrays is either consistent or inconsistent. Thus function may also be expressed as an equation in the form:

$$F(A,B,C)=A \cdot B+B \cdot C+A \cdot C$$

A similar function may be defined for any number of inputs. For example, for five configuration arrays, the following function may be used:

$$F(A,B,C,D,E)=A \cdot B+B \cdot C+C \cdot D+D \cdot E+A \cdot C+A \cdot D+A \cdot E+B \cdot D+B \cdot E+C \cdot E$$

In operation, three bits A, B, C, each representing configuration information from one of three independent but redundant configuration arrays 106, 108, 110 (FIG. 1) are each loaded into one of three latches 201, 203, 205, respectively. Then the values stored in the first and third latches 201, 205 are anded together by gate 207 (A·B), the values stored in the first and second latches 201, 203 are anded together by gate 209 (B·C), and the values stored in the second and third latches 203, 205 are anded together by gate 211 (A·C). Next, the outputs of each of the And gates 207, 209, 211 are ored by the Or gate 213 (A·B+B·C+A·C). The Or gate 213 outputs the results of the majority vote of the configuration information to the data array 104.

The particular majority voting logic circuit 130 shown in FIG. 2 is merely an example and many alternative or additional majority voting logic circuits, as well as alternative bit selection circuits, may be employed. For example, dissent detection logic 132 (FIG. 1) may be additionally employed to identify and record when (e.g., which address of the configuration array was being read) there is an inconsistency between the incoming configuration information as well as which configuration array provided the inconsistent information. Storing such information may allow the use of more sophisticated bit selection functions. For example, the reliability of a subsequent majority vote involving the same configuration information may be determined. In such case, if a second memory cell appears to have become unstable such that the configuration information output by a second configuration array is now matching the previously identified erroneous configuration information from a first configuration array, the logic 112 may override the majority vote outcome, and select the minority value of the configuration information from the third configuration array.

Figure 3:
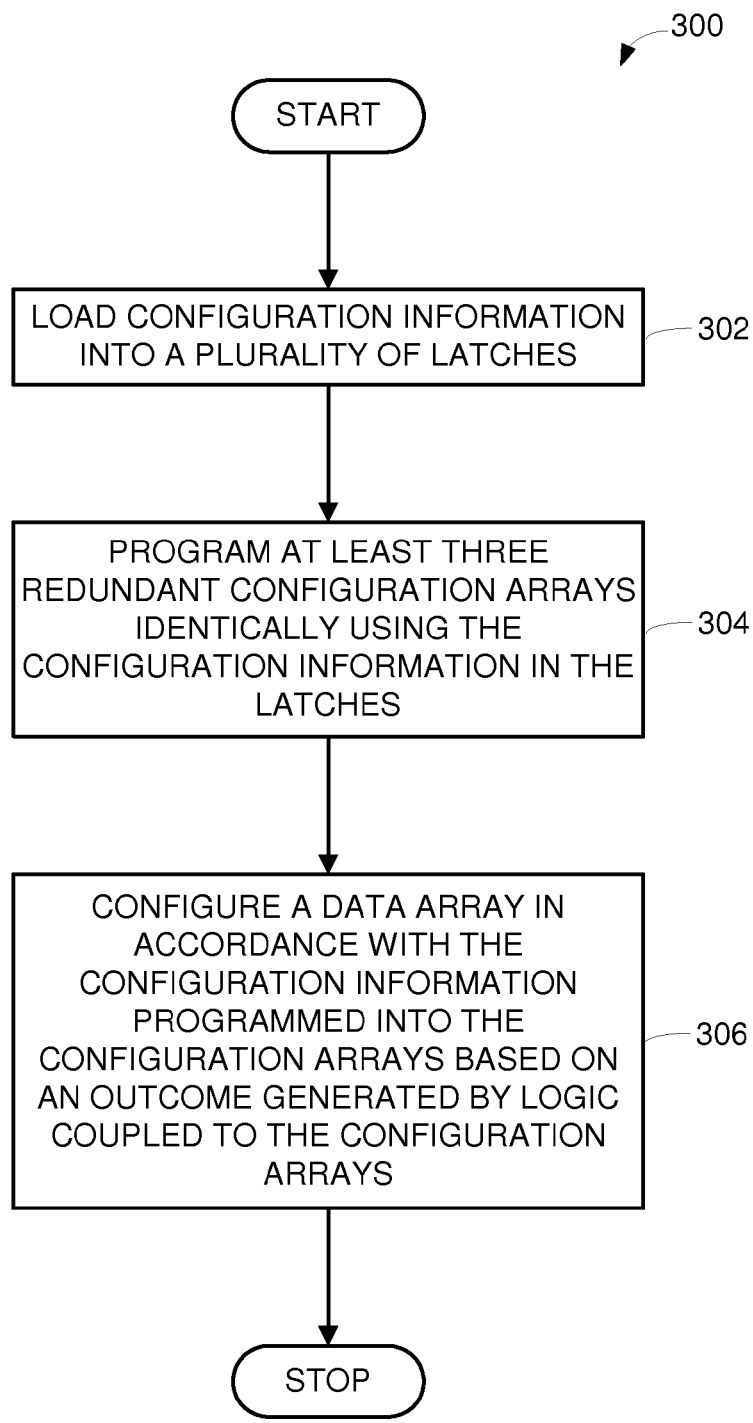
FIG. 3 is a flowchart that depicts operation of a memory system according to some embodiments of the present invention.

Turning to FIG. 3, a method 300 of using redundant configuration arrays to configure a data array according to embodiments of the present invention is depicted as a flowchart. As with the flowchart depicted in FIG. 4, the particular steps and the particular order shown are merely representative of example embodiments, and it will be understood that the present invention includes any combination of additional or fewer steps and/or sub-steps, performed in any practicable order.

In Step 302, configuration information specific to a data array is loaded into the input buffers (e.g., latches) of a plurality of redundant configuration arrays. The configuration information may be derived from the design, manufacturing, testing, and/or development of the data array 104. The configuration information may be loaded from a host or external system coupled to the configuration arrays 106, 108, 110 of the system 100 of the present invention.

In Step 304, the configuration information may be programmed into the plurality of configuration arrays. In some embodiments, at least three configuration arrays are programmed. Identical information is written into each of the at least three configuration arrays and may be verified by reading back the configuration information and comparing the read back data to the original data.

In Step 306, the data array associated with the configuration information is configured (e.g., operating modes are selected, trimbit values are set, reference voltages are set, etc.) using the configuration information read from each of the redundant configuration arrays. If the configuration information from the configuration arrays is inconsistent, a logic circuit is used to select which value of the configuration information should be used to configure the data array. In some embodiments, the logic circuit may apply a majority vote or other function to the differing values to make the selection.

Figure 4:
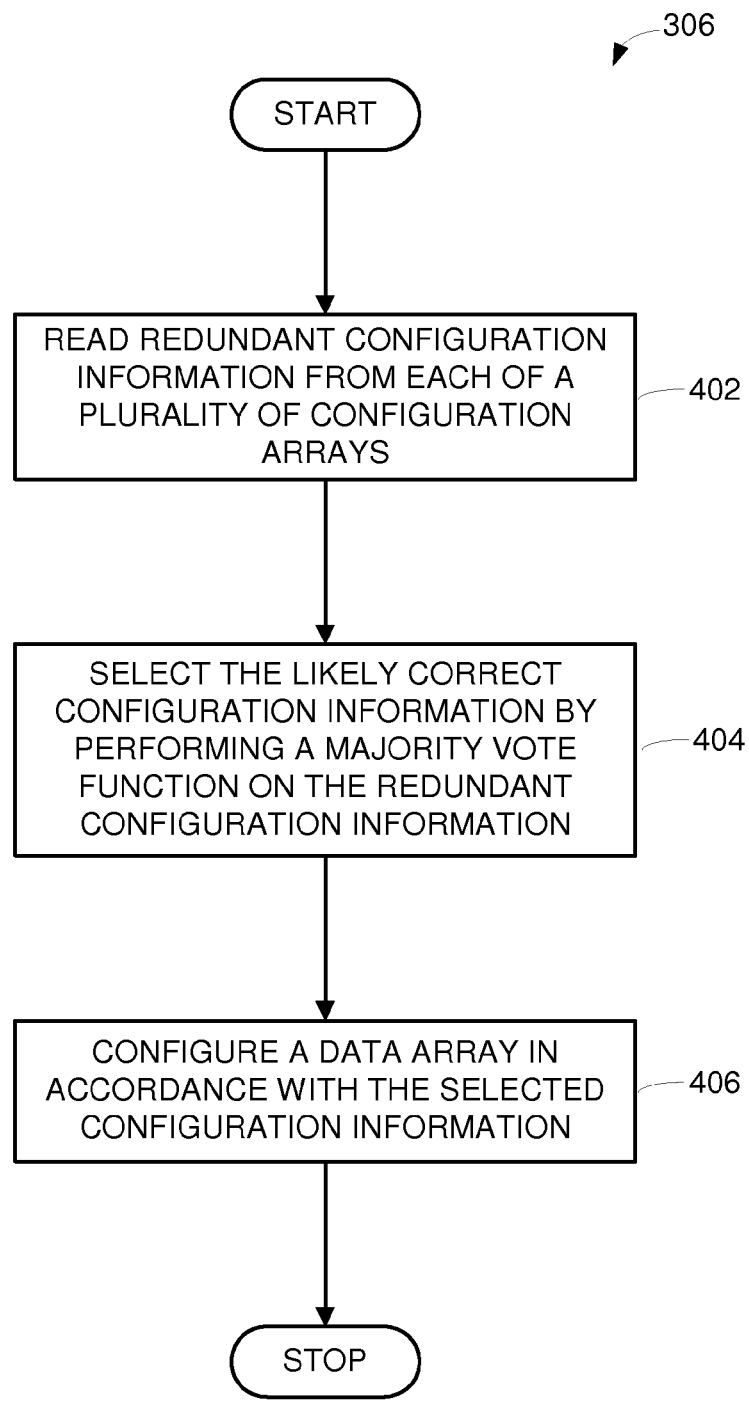
FIG. 4 is a flowchart that depicts operation of a memory system according to some embodiments of the present invention.

Turning to FIG. 4, details of Step 306 of FIG. 3 are illustrated as a flowchart depicting an additional method of the present invention. In Step 402, nominally redundant configuration information is read from each of the configuration arrays. In Step 404, the configuration information most likely to be correct is selected based upon applying a majority vote function (e.g., as defined in the above table) to the configuration information that was read from each of the configuration arrays. In Step 406, a data array associated with the configuration information is configured with the selected as most likely correct values of the configuration information.

The above example embodiments are described with respect to programmable memories. However, the principles of the present invention have application to other types of non-volatile memories, including those currently existing and those contemplated to use new technology being developed.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

The invention claimed is:

1. A memory comprising:
   a plurality of memory arrays, wherein the memory arrays include:
   a data array;
   at least three redundant configuration arrays, wherein the configuration arrays are each adapted to be programmed with identical configuration information associated with operation of the data array, and wherein the configuration arrays are disposed on different substrates; and
   dissent detection logic coupled to each of the configuration arrays.

2. The memory of claim 1 wherein the data array includes support logic and the configuration information is associated with operation of the support logic.

3. The memory of claim 1, further comprising logic coupled between the data array and each of the configuration arrays, wherein the logic is adapted to determine a configuration for the data array based upon an outcome of a majority vote function applied to the configuration information stored in the configuration arrays.

4. The memory of claim 1 wherein the data array includes a plurality of non-volatile memory cells.

5. The memory of claim 1 wherein the data array includes a plurality of two-terminal memory cells.

6. The memory of claim 1 wherein the data array includes at least one of flash memory, NAND flash memory, electrically erasable programmable memory, ultraviolet erasable programmable memory, magnetic memory, one time programmable memory, ferroelectric RAM, and carbon nanotube based memory.

7. The memory of claim 1 wherein the configuration information defines a logical structure of the data array.

8. The memory of claim 1 wherein the configuration information includes at least one of trimbit values, reference voltage values, and mode selection values.

9. The memory of claim 1 wherein the configuration arrays each include a plurality of non-volatile memory cells.

10. The memory of claim 1 wherein the configuration arrays each include a plurality of two-terminal memory cells.

11. The memory of claim 1 wherein the configuration arrays each include at least one of fuse based memory and antifuse based memory.

12. The memory of claim 1 wherein the configuration arrays are distributed on the substrate.

13. The memory of claim 1 where the configuration arrays are distributed on the substrate based upon at least one requirement of signal timing, substrate stress, reliability, and yield.

14. The memory of claim 1 wherein the number of configuration arrays included on the substrate is based on a reliability threshold.

15. The memory of claim 1 wherein the configuration arrays include error-correcting code (ECC) memory.

16. The memory of claim 1, further comprising majority vote logic coupled to each of the configuration arrays and adapted to determine a reliability rating of the configuration information stored in the configuration arrays.

17. A memory comprising:
a plurality of memory arrays including a primary array and a plurality of configuration arrays,
wherein the configuration arrays are each adapted to store redundant configuration information associated with operation of the primary array, and
wherein the configuration arrays are disposed on different substrates.

18. The memory of claim 17 wherein the primary array includes support logic and the configuration information is associated with operation of the support logic.

* * * * *